United States Patent
Tsai et al.

(10) Patent No.: US 10,121,843 B2
(45) Date of Patent: Nov. 6, 2018

(54) CORROSION RESISTANT TEST LINES

(71) Applicant: Apple Inc., Cupertino, CA (US)

(72) Inventors: Tsung-Ting Tsai, Taipei (TW);
Chin-Wei Lin, Cupertino, CA (US);
Jae Won Choi, Cupertino, CA (US);
Young Bae Park, San Jose, CA (US)

(73) Assignee: Apple Inc., Cupertino, CA (US)

(*) Notice: Subject to any disclaimer, the term of this patent is extended or adjusted under 35 U.S.C. 154(b) by 121 days.

(21) Appl. No.: 15/176,836

(22) Filed: Jun. 8, 2016

(65) Prior Publication Data
US 2017/0092711 A1 Mar. 30, 2017

Related U.S. Application Data

(60) Provisional application No. 62/235,160, filed on Sep. 30, 2015.

(51) Int. Cl.
*H01L 27/32* (2006.01)
*H01L 27/12* (2006.01)

(52) U.S. Cl.
CPC ........ *H01L 27/3276* (2013.01); *H01L 27/124* (2013.01)

(58) Field of Classification Search
None
See application file for complete search history.

(56) References Cited

U.S. PATENT DOCUMENTS

| | | | |
|---|---|---|---|
| 5,250,470 A | 10/1993 | Yamaguchi | |
| 5,598,283 A * | 1/1997 | Fujii | G02F 1/1345 349/143 |
| 5,949,502 A | 8/1999 | Matsunaga et al. | |
| 6,005,647 A * | 12/1999 | Lim | G02F 1/136204 349/139 |
| 6,025,891 A * | 2/2000 | Kim | G02F 1/136204 349/40 |
| 6,320,137 B1 | 11/2001 | Bonser et al. | |
| 6,734,925 B1 * | 5/2004 | Lee | G02F 1/1345 349/40 |
| 7,110,057 B2 * | 9/2006 | Jeon | G02F 1/136286 349/139 |
| 8,053,293 B2 * | 11/2011 | Kim | G02F 1/1309 257/E21.521 |
| 8,564,970 B2 * | 10/2013 | Chen | H05K 1/0268 174/254 |

(Continued)

*Primary Examiner* — Lex Malsawma
(74) *Attorney, Agent, or Firm* — Treyz Law Group, P.C.; G. Victor Treyz; David K. Cole

(57) ABSTRACT

A display may have an array of pixels formed from thin-film transistor circuitry. The thin-film transistor circuitry may include thin-film layers of dielectric, semiconductor, and metal on a dielectric substrate. Test structures may be formed around the periphery of the substrate to facilitate testing of the thin-film circuitry during manufacturing. The test structures may include test pads that are coupled to the thin-film circuitry by test lines extending from the thin-film circuitry. Following testing, the outermost portions of the display and the test pads on these display portions may be removed by cutting the substrate along a substrate cut line. The test lines may be formed from parallel lines that are shorted together, semiconductor layers, multiple layers of conductive material, and other structures that resist corrosion along the cut line.

19 Claims, 9 Drawing Sheets

(56) References Cited

U.S. PATENT DOCUMENTS

| | | | |
|---|---|---|---|
| 8,598,780 B2 | 12/2013 | Kim et al. | |
| 9,312,319 B2 | 4/2016 | Lee et al. | |
| 2001/0045997 A1* | 11/2001 | Kim | G02F 1/136204 |
| | | | 349/40 |
| 2004/0125307 A1* | 7/2004 | Lee | G02F 1/1362 |
| | | | 349/149 |
| 2006/0067143 A1* | 3/2006 | Kim | G02F 1/1362 |
| | | | 365/201 |
| 2010/0039119 A1* | 2/2010 | Lee | G02F 1/1362 |
| | | | 324/538 |
| 2011/0102694 A1* | 5/2011 | Cho | H01L 27/124 |
| | | | 349/39 |
| 2014/0319471 A1* | 10/2014 | Kim | H01L 22/32 |
| | | | 257/40 |
| 2015/0144940 A1* | 5/2015 | Hong | H01L 22/32 |
| | | | 257/43 |
| 2015/0200145 A1* | 7/2015 | Yoo | H01L 22/32 |
| | | | 349/42 |
| 2016/0172623 A1* | 6/2016 | Lee | H01L 51/5253 |
| | | | 257/40 |

\* cited by examiner

CORROSION RESISTANT TEST LINES

This application claims the benefit of provisional patent application No. 62/235,160, filed Sep. 30, 2015, which is hereby incorporated by reference herein in its entirety.

BACKGROUND

This relates generally to electronic devices and, more particularly, to electronic devices having substrates with peripheral test structures.

Electronic devices may include displays. Displays are often formed using thin-film circuitry on a dielectric substrate. During manufacturing, the circuitry may be tested using peripheral test pads that are coupled to the circuitry with test lines. Following testing, substrate edges may be trimmed to remove the test pads. The trimming process may involve cutting through the test lines to remove test pad structures that are not needed during normal operation. Trimming operations such as these may reduce the size of a display, but can expose edge portions of the test lines to potentially corrosive conditions. If care is not taken, moisture can intrude inwardly to the circuitry of the display and can cause circuit faults and visible damage.

It would therefore be desirable to be able to provide components such as displays with improved test structures.

SUMMARY

A display may have an array of pixels arranged in rows and columns. The array of pixels may be used to display images within an active area of the display.

The array of pixels may be formed from thin-film transistor circuitry. The thin-film transistor circuitry may include thin-film layers of dielectric, semiconductor, and conductive material on a dielectric substrate. The array of pixels may be, for example, an array of organic light-emitting diode pixels.

Test structures may be formed around the periphery of the substrate to facilitate testing of the thin-film circuitry during manufacturing. The test structures may include test pads that are coupled to the thin-film circuitry by test lines extending from the thin-film circuitry. Following testing operations in which a tester applies test signals to the test pads, the outermost portions of the display and the test pads on these display portions may be removed from the display by cutting the substrate along a substrate cut line.

To reduce the risk of moisture intrusion and corrosion along the exposed portions of the test lines at the cut line, the test lines may have portions that are formed from multiple parallel test lines shorted together. Test lines may also be formed from multiple conductive thin-film layers to resist moisture intrusion and corrosion. If desired, portions of the test lines may be formed from materials that are resistant to corrosion such as semiconductor materials.

Further features will be more apparent from the accompanying drawings and the following detailed description.

DETAILED DESCRIPTION

Figure 1:
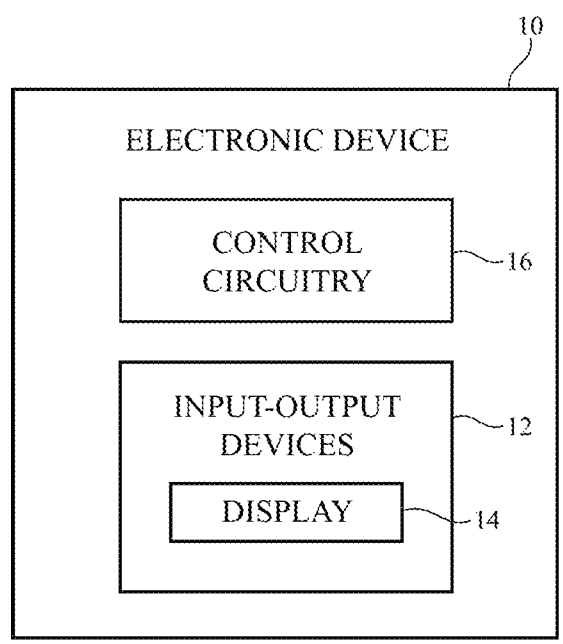
FIG. 1 is a diagram of an illustrative electronic device having a display in accordance with an embodiment.

An illustrative electronic device of the type that may be provided with a display is shown in FIG. 1. Electronic device 10 may be a cellular telephone, a portable computer, a wristwatch device, a desktop computer, a monitor, a set-top box, or other electronic equipment. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. Display 14 may be an organic light-emitting diode display or other display with light-emitting diodes, may be a liquid crystal display, or may be a display formed using other types of display technology. Configurations in which display 14 is an organic light-emitting diode display may sometimes be described herein as an example.

Control circuitry 16 may be used to run software on device 10 such as operating system code and applications. During operation of device 10, the software running on control circuitry 16 may display images on display 14.

Displays and other components in device 10 may have dielectric substrates (e.g., substrates formed from glass, ceramic, rigid or flexible printed circuit board material such as sheets of polymer, etc.). Circuitry such as thin-film circuits may be fabricated on the substrates. Defects may sometimes arise during fabrication, so it is often desirable to test displays and other components as part of a manufacturing process. If a display or other component has faults, the faults can be corrected or the display can be discarded.

In a typical test arrangement, test lines extend outwardly from a central region on the substrate that has thin-film circuitry for a display or other component. The test lines may terminate in a set of test pads. During testing, a test probe associated with a tester may contact the test pads and may transmit and receive test signals to test the thin-film circuitry. Following successful testing, the test pads are no longer needed and can be removed to reduce the footprint of the display or other component. Illustrative configurations in which displays are trimmed in this way may sometimes be described herein as an example. If desired, however, other types of components that have thin-film circuitry formed on a dielectric substrate may be provided with removable peripheral test pads.

Figure 2:
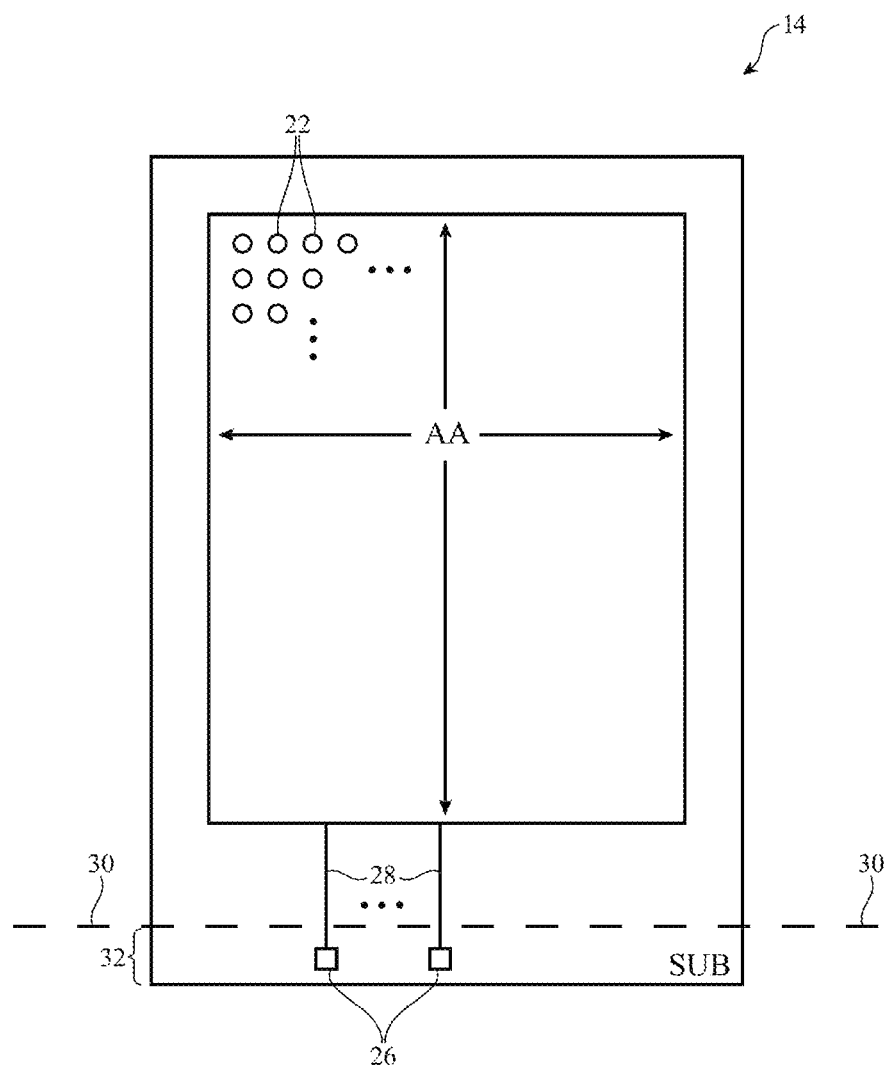
FIG. 2 is a diagram of an illustrative display in accordance with an embodiment.

A top view of an illustrative display with removable test pads is shown in FIG. 2. As shown in FIG. 2, display 14 may have an array of pixels 22 for displaying images for a user. The array of pixels 22 may be arranged to form rows and columns in active area AA of display 14. During operation, images are displayed on display 14 in active area AA. There may be any suitable number of rows and columns in the array of pixels 22 in active area AA (e.g., ten or more, one hundred or more, or one thousand or more). Pixels 22 may each contain subpixels of different colors. As an example, each pixel 22 may have a red subpixel that emits red light, a green subpixel that emits green light, and a blue subpixel that emits blue light.

Active area AA may be rectangular, circular, oval, or may have other suitable shapes. Display 14 may have an inactive border (sometimes referred to as an inactive area) that runs along one or more edge of the active area AA. Display driver circuitry (e.g., data line driver circuitry and/or gate driver circuitry) may be located in one or more of the inactive borders. The inactive area may also include test structures such as test pads 26. Test pads 26 may be formed along one or more of the edges of display 14 (i.e., test pads 26 may extend along the periphery of display 14). Test lines 28 may be used to couple respective test pads 26 to the thin-film circuitry of active area AA (i.e., circuitry for pixels 22).

During testing, a tester may couple test pins to pads 26. Using the test pins, the tester can apply power supply voltages and test signals such as clock and data signals to display 14 and can measure resulting test signal output to determine whether display 14 is functioning properly. If display 14 is free of faults, display 14 can be incorporated into device 10 (FIG. 1). If faults are detected during testing, display 14 may be reworked or discarded.

Test pads 26 are not needed after testing is complete, so test pads 26 may be formed in a sacrificial portion of display 14 such as outer edge portion 32. Edge portion 32 may form part of a mother glass substrate or may be an edge portion of a singulated display panel. When testing has been completed, a saw, a laser, a grinding tool, a water jet cutting tool, or other cutting equipment may be used to remove unwanted display structures such as edge portion 32 (e.g., by cutting along cut line 30). By removing portions of display 14 that contain test pads 26 and portions of test lines 28, the size of display 14 (i.e., the area or "footprint" consumed by display 14) may be minimized. This allows the size of the housing for device 10 to be minimized.

Pixels 22 may be formed from thin-film circuitry on substrate SUB. Substrate SUB may be formed from a dielectric such as glass, ceramic, polymer (e.g., a flexible sheet of polyimide or other polymer layer), or other substrate material. During cutting operations to remove portion 32 of display 14, test pads 26, portions of test lines 28, and other peripheral structures on substrate SUB in region 32 may be removed. This exposes the edges of test lines 28 along cut line 30, leading to a potential ingress route for moisture. If care is not taken, moisture ingress along lines 28 may cause corrosion and damage to thin-film circuitry in active area AA.

To help reduce corrosion, test lines 28 can be formed from robust structures such as materials that are resistant to corrosion and structures that help prevent moisture from intruding inwardly towards active area AA.

Figure 3:
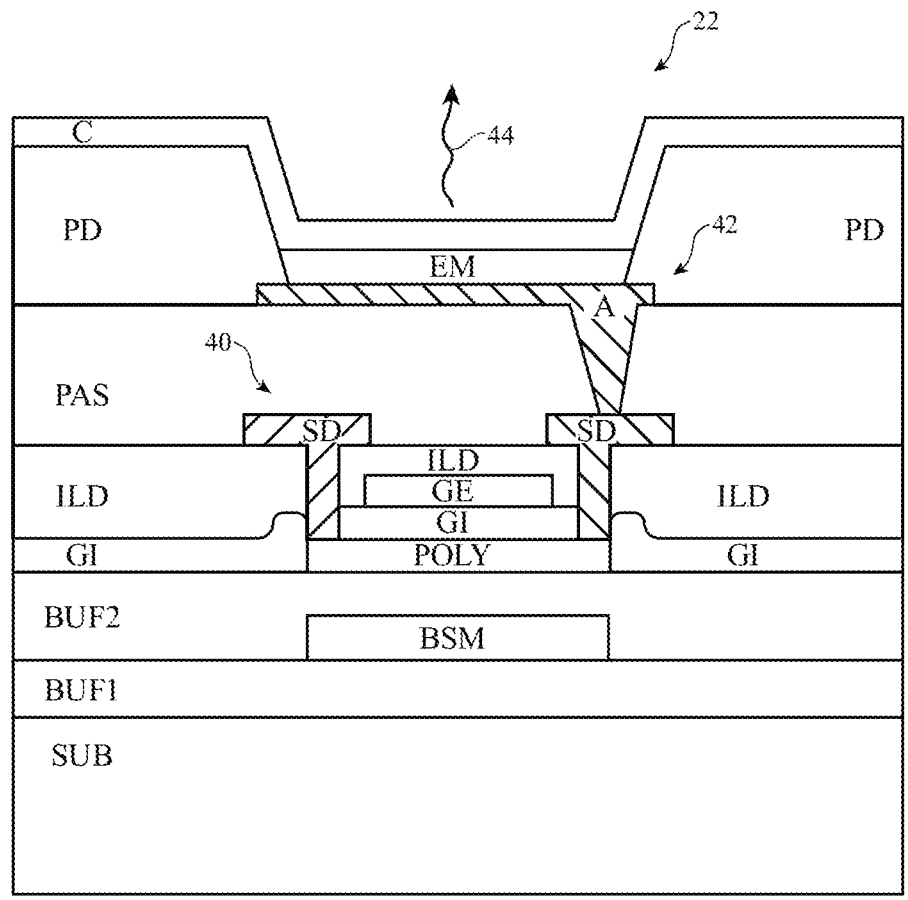
FIG. 3 is a cross-sectional side view of an illustrative display in accordance with an embodiment.

Robust structures for test structures such as test lines 28 can be formed using the conductive thin film layers that are used in forming signal paths in the circuitry of active area AA. The number and composition of these conductive thin-film layers can vary from display to display, depending on the type of pixels 22 that are being formed and other display attributes. A cross-sectional side view of display 14 in an illustrative configuration in which pixels 22 are formed from thin-film transistor circuitry with organic light-emitting diodes is shown in FIG. 3. The arrangement of FIG. 3 is, however, merely illustrative. Display 14 may, in general, be formed from any suitable thin-film circuitry.

As shown in FIG. 3, display 14 may be formed from thin-film structures on a substrate such as substrate SUB. Substrate SUB may be formed from a dielectric such as glass, ceramic, polymer, etc. One or more dielectric layers such as buffer layers BUF1 and BUF2 may be formed on substrate SUB. Buffer layers BUF1 and BUF2 may, for example, be formed from silicon oxide, silicon nitride, and/or other inorganic layers. Organic layers may also be used for forming one or more of the dielectric layers of display 14.

A metal layer such as metal layer BSM may be used to form light shielding under transistor 40 and light-emitting diode 42 for pixel 22. Metal layer BSM, which may sometimes be referred to as a light shield metal layer or shield layer, may be formed between buffer layers BUF1 and BUF2 (as an example).

Thin-film transistor circuitry for pixels 22 such as illustrative transistor 40 may have a channel region formed from thin-film semiconductor layer POLY (e.g., polysilicon layer, a semiconducting-oxide layer such as a layer of indium gallium zinc oxide, or other semiconductor layer). Gate insulator layer GI may cover semiconductor layer POLY. Gate insulator layer GI may be formed from silicon oxide or other dielectric material. A gate terminal G for transistor 40 may be formed from gate electrode layer GE. Layer GE may be a layer of metal or other conductive material. In configurations in which layer GE is formed from metal, layer GE may sometimes be referred to as a gate electrode metal layer.

Display 14 may contain one or more layers of dielectric to support and separate interconnect lines, transistor terminals, and other conductive structures in display 14. These layers of dielectric may sometimes be referred to as interlayer dielectric layers. In the example of FIG. 3, display 14 has an interlayer dielectric layer ILD that covers gate electrode (gate metal) layer GE. Interlayer dielectric layer ILD may be formed from silicon oxide, silicon nitride, and/or one or more other inorganic layers (as an example).

Metal layers such as a metal layer SD (sometimes referred to as a source-drain layer) may be used in forming source and drain terminals for transistor 40 and for forming signal lines.

One or more passivation layers such as illustrative passivation layer PAS may cover the structures of transistor 40. Passivation layer PAS may include one or more inorganic and/or one or more organic layers. For example, passivation layer PAS may include an inorganic passivation layer and an organic passivation layer (e.g., a planarization layer), may include one or more inorganic layers, may include one or more organic layers, may be a single layer of dielectric (organic or inorganic), and/or may be formed from other layers of dielectric.

Light-emitting diode 42 may emit light 44 for pixel 22. Diode 42 may have a first terminal such as an anode formed from metal layer A (e.g., a metal anode layer or other conductive layer of material). A layer of organic emissive material EM may be interposed between the anode and cathode for diode 42. The cathode for diode 42 may be formed from a blanket conductive film such as conductive cathode layer C. Layer C may be formed from indium tin oxide, thin metal (e.g., metal that is sufficiently thin to be transparent to light 44), or a layer or other conductive material. Diode 42 may be formed from emissive material EM that is located in an opening formed from pixel definition layer PD. Layer PD may be formed from a layer of dielectric (e.g., a layer of polyimide or other polymer).

Figure 4:
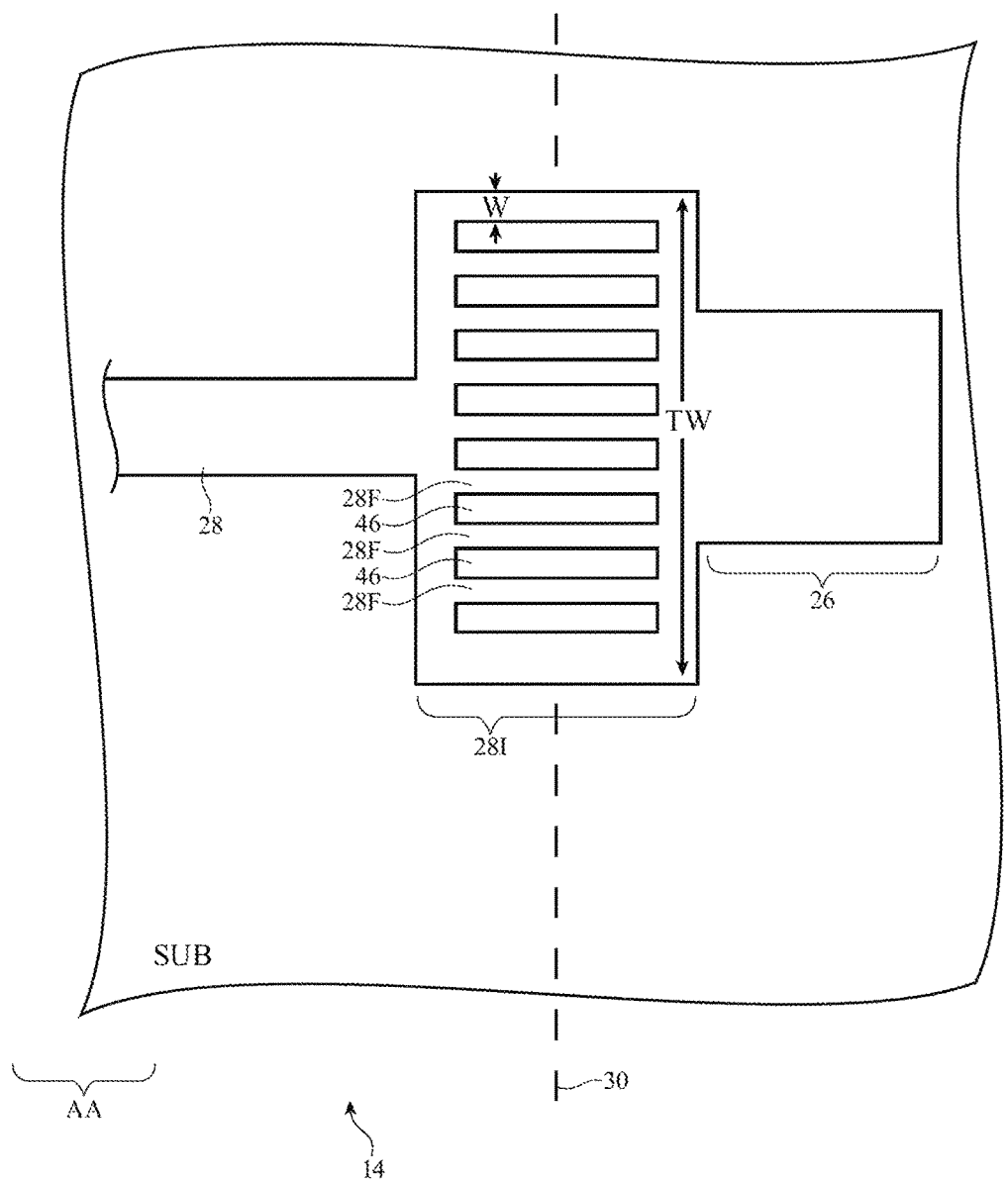
FIG. 4 is a top view of a test structure with having a test line portion with parallel test lines that are shorted together in accordance with an embodiment in accordance with an embodiment.

To help prevent intrusion of moisture along lines 28 from the exposed edge of display 14 (after cutting away portion 32 of substrate SUB along line 30 of FIG. 2), lines 28 may be formed using multiple parallel fingers. Consider, as an example, the configuration of FIG. 4. In the example of FIG. 4, test pad 26 has been formed at the end of a test line 28. Test line 28 extends between active area AA of display substrate SUB and removable portion 32 of substrate SUB. As shown in FIG. 4, an intermediate portion 28I of line 28 that lies between pad 26 and active area AA may be provided with multiple parallel fingers 28F (i.e., multiple parallel lines that are shorted together to form portion 28I of line 28).

Figure 5:
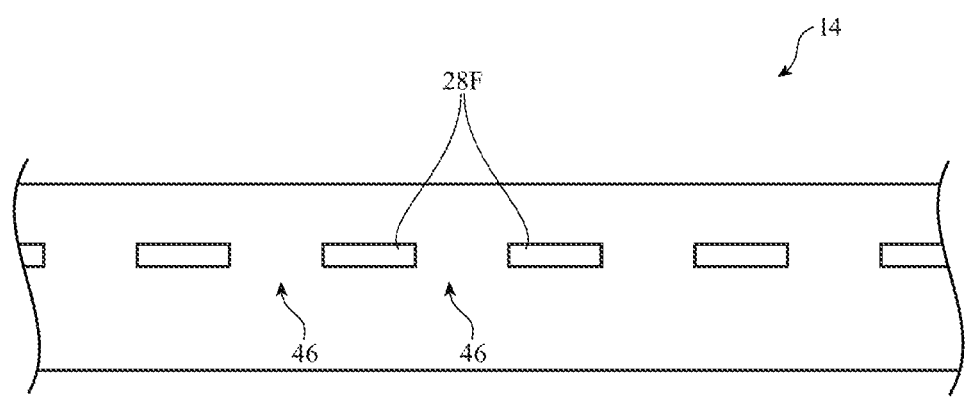
FIG. 5 is cross-sectional side view of the illustrative parallel test line structures of FIG. 4 in accordance with an embodiment.

Each finger 28F is a narrow line that has a width W of about 50-250 microns, more than 40 microns, less than 500 microns, or other suitable size. The length of each finger 28F may be greater than its width (i.e., each finger 28F may have an elongated shape that runs parallel to line 26). The length of each finger 28F may be more than 200 microns, more than 1 mm, less than 2 mm, or other suitable length). Elongated openings 46 that are filled with thin-film dielectric layers may separate respective adjacent fingers 28F from each other. The total width TW of portion 28I of line 28 may be about 2 mm, 1-3 mm, less than 3 mm, less than 1 mm, more than 0.1 mm, or other suitable width. When cut along line 30, display 14 has a cross-sectional appearance of the type shown in FIG. 5. Each line portion 28F has a relatively small width W and is therefore has a minimized risk of separating from adjacent dielectric and allowing moisture to penetrate to active area AA along the length of line 28. Regions with multiple parallel lines that are shorted together such as region 28I may overlap cut line 30 and/or may be placed elsewhere along the length of line 28.

Figure 6:
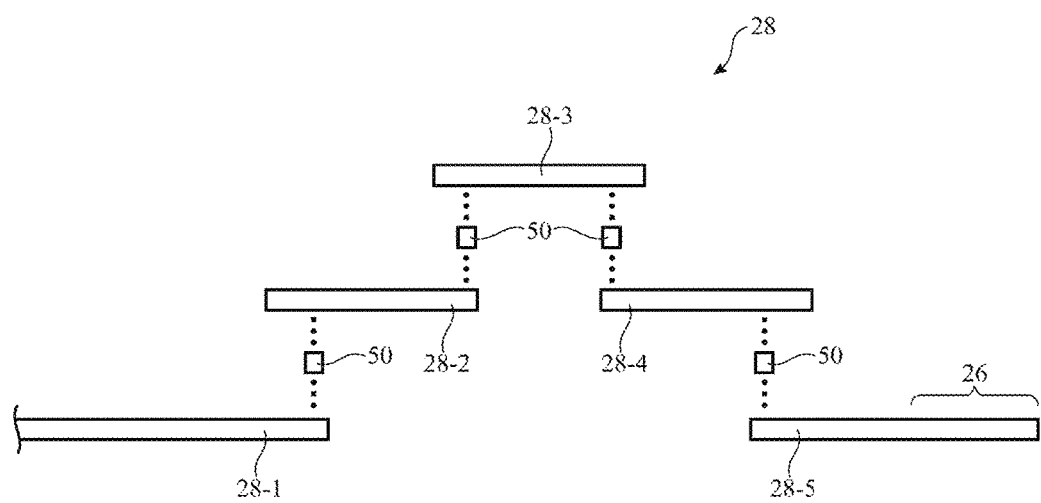
FIG. 6 is a cross-sectional side view of illustrative test structures formed from multiple conductive thin-film layers in accordance with an embodiment.

Moisture intrusion and corrosion along test lines 28 may also be reduced by forming lines 28 from multiple conductive thin-film layers. An illustrative configuration in which line 28 is formed from portions of multiple layers 28-1, 28-2, 28-3, 28-4, 28-5 is shown in FIG. 6. Moisture may have difficulty following a path of the type shown in FIG. 6 that travels up and/or down through different conductive thin-film layers of material, so structures of the type shown in FIG. 6 may help improve the reliability of test lines 28. Layers such as layers 28-1 and 28-5 may be formed from the same layer or different layers. Similarly, layers 28-2 and 28-4 of FIG. 6 may be formed from the same layer or different layers. Layer 28-3 may be a different layer than layers 28-1, 28-2, 28-4, and 28-5 (as an example). Test line path 28 may be formed from portions of one or more conductive thin-film layers, two or more conductive thin-film layers, three or more conductive thin-film layers, at least four conductive thin-film layers, fewer than seven conductive thin-film layers, or other suitable number of conductive thin-film layers of material. The layers of material may be lower and/or higher than pad 26 in the thin-film stack of materials that forms display 14.

Figure 7:
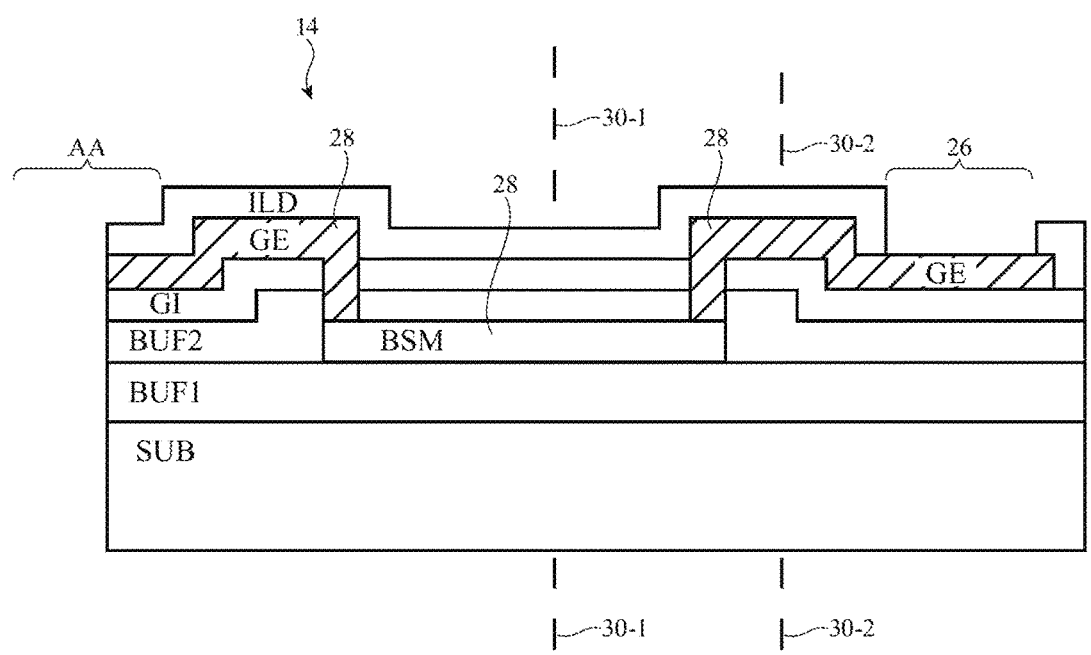
FIGS. 7, 8, and 9 are cross-sectional side views of illustrative test structures formed from thin-film layers on substrates such as display substrates in accordance with embodiments.

In the illustrative configuration of FIG. 7, line 28 has been formed from a portion of gate electrode layer GE that extends outwardly from active area AA, a portion of shield metal layer BSM, and a portion of gate electrode layer GE that also forms pad 26. The line that separates region 32 of substrate SUB from the remaining portion of substrate SUB following testing may overlap the portion of line 28 formed from shield metal BSM (see, e.g., illustrative cut line 30-1) or the gate electrode portion of line 28 that is interposed between shield metal BSM and the portion of gate electrode GE that forms pad 26 (see, e.g., illustrative cut line 30-2). The structure of FIG. 7 helps to reduce moisture intrusion into active area along line 28 by introducing a second conductive layer (layer BSM) into line 28 in addition to gate electrode layer GE. If desired, portions of line 28 such as layer BSM that are located along cut line 30-1 or portions of gate electrode 28 that are located along cut line 30-2 may be formed from finger structure such as structures 28F of FIG. 4.

Figure 8:
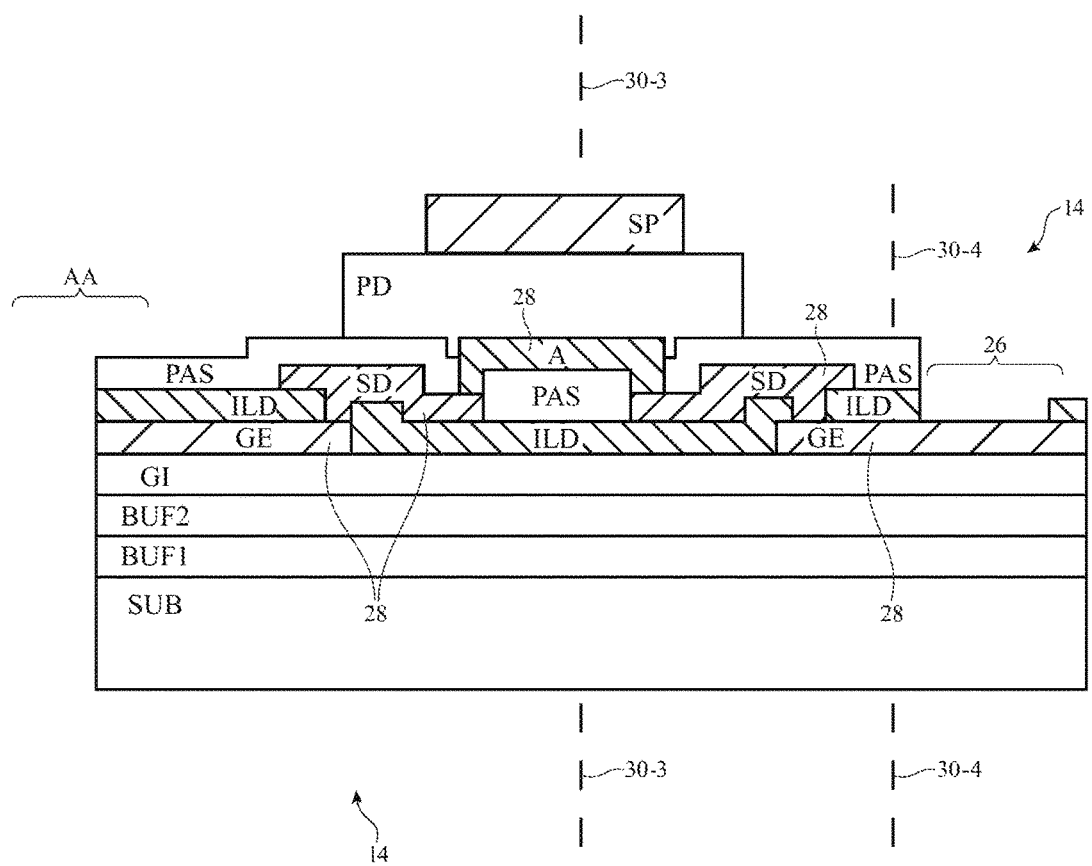

In the illustrative configuration of FIG. 8, display 14 has a spacer structure SP (e.g., a structure formed from polymer that helps prevent contact between a fine metal mask and display 14 during fabrication). Spacer SP may overlap pixel definition layer PD. Gate line 28 may be formed from a portions of gate electrode layer GE that extends outwardly from active area AA toward pad 26, a first portion of source-drain layer SD, a portion of anode layer A, a second portion of source-drain layer SD, and a portion of gate electrode layer GE that forms pad 26. Cut line 30 may overlap anode layer A (see, e.g., illustrative cut line 30-3), may overlap a portion of the gate electrode layer GE that extends between the second portion of source-drain layer SD and the portion of layer GE that forms pad 26 (see, e.g., illustrative cut line 30-4), or may be formed elsewhere along line 28. If desired, one or more of the portions of line 28 (e.g., the portions overlapped by cut line 30-3 or cut line 30-4) may be formed from multiple parallel fingers 28F.

Figure 9:
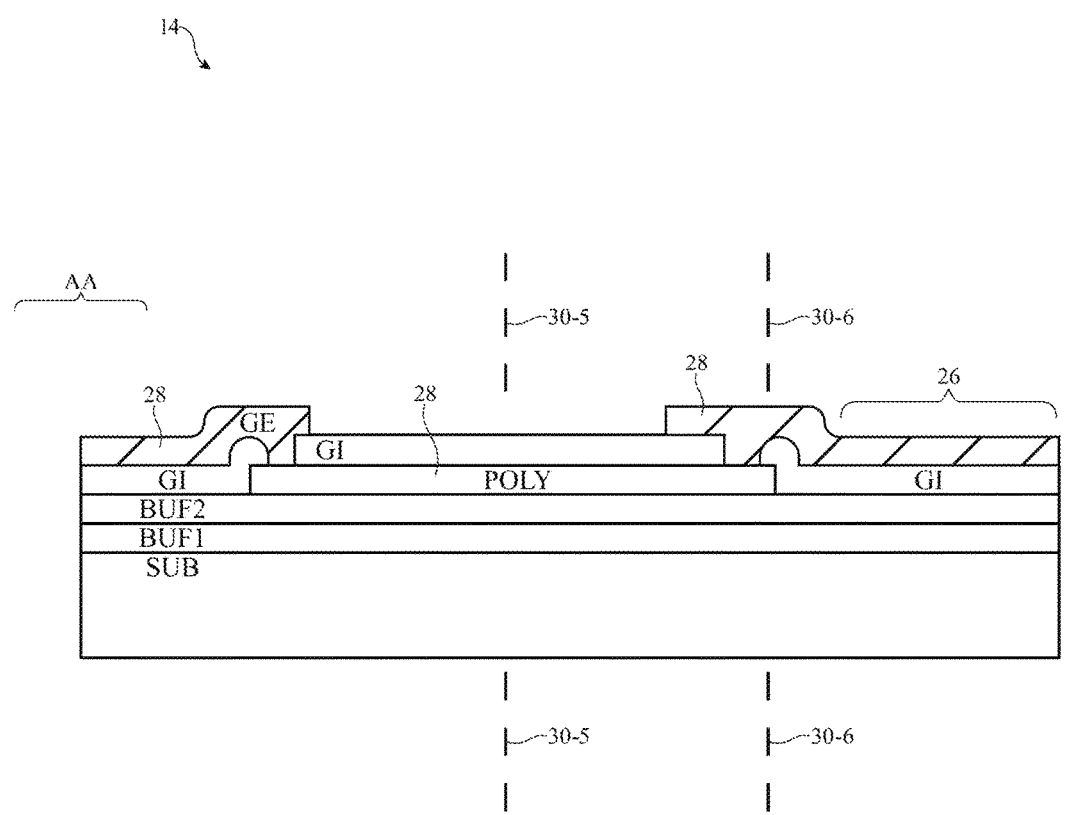

FIG. 9 is a cross-sectional side view of display 14 in an illustrative configuration in which test line 28 has been formed using a portion of semiconductor layer POLY (e.g., a doped polysilicon layer or a doped semiconducting-oxide layer such as a layer of doped indium gallium zinc oxide). As shown in FIG. 9, line 28 may include a first portion of gate electrode layer GE that extends outwardly towards pad 26 from active area AA, a portion of semiconductor layer POLY, and a second portion of gate electrode layer GE. The second portion of gate electrode layer GE may form pad 26. The semiconductor portion of line 28 may have multiple parallel fingers 28F and may overlap cut line 30-5. Semiconductor materials may be less susceptible to corrosion upon exposure to moisture than metals, so the use of layer POLY in the portion of test line 28 that overlaps cut line 30-5 may help enhance test line reliability. If desired, cut line 30 may be located where illustrated by cut line 30-6. In this type of arrangement, the portion of gate electrode layer GE that forms test line 28 under cut line 30-6 may be provided with multiple parallel fingers 28F.

If desired, test structures of the type shown in FIGS. 7, 8, and 9 and/or other test structures may have test lines 28 that incorporate additional conductive thin-film layers (e.g., one or more, two or more, or three or more additional conductive layers such as the conductive layers of FIG. 3 and/or other conductive layers). The configurations of FIGS. 7, 8, and 9 are merely illustrative. Test lines 28 may also be used to route signals from thin-film circuitry on a substrate to test pads 26 in components other than displays.

The foregoing is merely illustrative and various modifications can be made by those skilled in the art without departing from the scope and spirit of the described embodiments. The foregoing embodiments may be implemented individually or in any combination.

What is claimed is:

1. A component, comprising:
    a substrate;
    thin-film transistor circuitry on the substrate, wherein the thin-film transistor circuitry includes conductive thin-film layers connected to a thin-film transistor;
    a test line that extends outwardly from the thin-film transistor circuitry to a substrate cut line at an edge of the substrate, wherein the test line comprises at least two of the conductive thin-film layers and wherein a portion of the test line that extends to the substrate cut line at the edge of the substrate includes multiple parallel lines that are shorted together; and
    a dielectric layer that covers the entire test line.

2. The component defined in claim 1 wherein one of the at least two conductive thin-film layers comprises a semiconductor layer.

3. The component defined in claim 2 wherein the multiple parallel lines are formed from the semiconductor layer.

4. The component defined in claim 3 wherein the thin-film transistor circuitry forms an array of display pixels.

5. The component defined in claim 1 wherein a first of the at least two conductive thin-film layers comprises a gate electrode layer and a second of the at least two conductive thin-film layers comprises a semiconductor layer.

6. The component defined in claim 5 wherein the multiple parallel lines are formed from the gate electrode layer.

7. The component defined in claim 6 wherein the thin-film transistor circuitry forms an array of display pixels.

8. The component defined in claim 1 wherein the at least two conductive thin-film layers include an anode layer, wherein the thin-film transistor circuitry forms an array of display pixels each of which has a light-emitting diode with an anode formed from a portion of the anode layer, and wherein the multiple parallel lines are formed from the anode layer.

9. The component defined in claim 1 wherein the at least two conductive thin-film layers include an anode layer, a source-drain layer, and a gate electrode layer, wherein the thin-film transistor circuitry forms an array of display pixels each of which has a light-emitting diode with an anode formed from a portion of the anode layer, and wherein the multiple parallel lines are formed from the gate electrode layer.

10. The component defined in claim 1 wherein the at least two conductive thin-film layers include a light shield layer and a gate electrode layer and wherein the multiple parallel lines are formed from the light shield layer.

11. The component defined in claim 1 wherein the at least two conductive thin-film layers include a light shield layer and a gate electrode layer and wherein the multiple parallel lines are formed from the gate electrode layer.

12. A display, comprising:
    a substrate;
    thin-film transistor circuitry on the substrate, wherein the thin-film transistor circuitry includes conductive thin-film layers that form an array of pixels; and
    a test line that extends outwardly from the thin-film transistor circuitry that forms the array of pixels to a substrate cut line at an edge of the substrate, wherein the conductive thin-film layers include a source-drain layer, a gate electrode layer, and an anode layer and wherein the test line is formed at least partly from the anode layer.

13. The display defined in claim 12 wherein the test line is formed at least partly from the source-drain layer.

14. The display defined in claim 13 wherein the test line is formed at least partly from the gate electrode layer.

15. The display defined in claim 14 wherein the gate electrode layer in the test line is cut along the substrate cut line at the edge of the substrate.

16. The display defined in claim 15 wherein the gate electrode has a plurality of parallel lines that are shorted together and wherein the parallel lines are cut along the substrate cut line at the edge of the substrate.

17. The display defined in claim 12 wherein the test line is formed at least partly from the source-drain layer.

18. The display defined in claim 12 wherein the anode layer in the test line is cut along the substrate cut line at the edge of the substrate.

19. An organic light-emitting diode display, comprising:
    a substrate;
    thin-film transistor circuitry on the substrate that forms an array of pixels each of which includes a respective light-emitting diode; and
    a test line formed from a conductive layer in the thin-film transistor circuitry, wherein the test line extends outwardly from the thin-film transistor circuitry that forms the array of pixels to a substrate cut line at an edge of the substrate, wherein the test line has a portion with a plurality of parallel lines formed from the conductive layer that are shorted together, and wherein the parallel lines are cut along the substrate cut line at the edge of the substrate.

* * * * *